(12) United States Patent
Vakhshoori et al.

(10) Patent No.: US 7,068,905 B2
(45) Date of Patent: Jun. 27, 2006

(54) EXTENDED OPTICAL BANDWIDTH SEMICONDUCTOR SOURCE

(76) Inventors: Daryoosh Vakhshoori, 10 Rogers St., Apt. 205, Cambridge, MA (US) 02142; Kevin J. Knopp, 55 Curzon's Mill Rd., Newburyport, MA (US) 01950; Peidong Wang, 225 Davis Rd., Carlisle, MA (US) 01741; Masud Azimi, 101 Fletcher Rd., Belmont, MA (US) 02478

( * ) Notice: Subject to any disclaimer, the term of this patent is extended or adjusted under 35 U.S.C. 154(b) by 0 days.

(21) Appl. No.: 10/800,206

(22) Filed: Mar. 12, 2004

(65) Prior Publication Data
US 2004/0247275 A1     Dec. 9, 2004

Related U.S. Application Data

(63) Continuation-in-part of application No. 10/632,779, filed on Aug. 1, 2003.

(60) Provisional application No. 60/549,310, filed on Mar. 2, 2004, provisional application No. 60/454,036, filed on Mar. 12, 2003.

(51) Int. Cl.
   *G02B 6/10*        (2006.01)
   *H01S 3/10*        (2006.01)
   *H01S 3/00*        (2006.01)

(52) U.S. Cl. ............................ 385/129; 385/8; 385/31; 385/39; 385/40; 359/333; 359/342; 359/344; 372/23; 372/43.01; 372/66; 372/97

(58) Field of Classification Search .................. 385/14, 385/122, 123, 129; 359/341
See application file for complete search history.

(56) References Cited

U.S. PATENT DOCUMENTS

| | | | |
|---|---|---|---|
| 6,038,239 A | | 3/2000 | Gabbert |
| 6,141,477 A | * | 10/2000 | Kitamura ..................... 385/131 |
| 6,212,310 B1 | | 4/2001 | Waarts et al. |
| 6,292,288 B1 | | 9/2001 | Akasaka et al. |
| 6,522,465 B1 | | 2/2003 | Goldstein |
| 6,542,287 B1 | | 4/2003 | Ye et al. |
| 6,614,819 B1 | * | 9/2003 | Fish et al. ..................... 372/26 |

(Continued)

OTHER PUBLICATIONS

Yu, S.F., et al., Semiconductor Laser Using Diffused Quantum-Well Structures, IEEE Journal of Selected Topics in Quantum Electronics, Jul./Aug. 1998, 723-735, vol. 4, No. 4.

(Continued)

*Primary Examiner*—Frank G. Font
*Assistant Examiner*—Ryan Lepisto
(74) *Attorney, Agent, or Firm*—Pandiscio & Pandiscio

(57) ABSTRACT

An optical bandwidth source for generating amplified spontaneous emission (ASE) across a selected wavelength range, the optical bandwidth source including a waveguide having a first end and a second end, and comprising a plurality of separate wavelength gain subsections arranged in a serial configuration between the first end and the second end so as to collectively form an active waveguide between the first end and the second end; wherein each of the wavelength gain subsections is configured to produce ASE across a wavelength range which is less than, but contained within, the selected wavelength range, whereby the plurality of separate wavelength gain subsections collectively produce ASE across the selected wavelength range.

28 Claims, 3 Drawing Sheets

U.S. PATENT DOCUMENTS

| | | | |
|---|---|---|---|
| 6,697,558 B1 | 2/2004 | Hansen et al. | |
| 6,751,013 B1* | 6/2004 | Wu | 359/337 |
| 6,804,281 B1* | 10/2004 | Walpole et al. | 372/45 |
| 2002/0118445 A1 | 8/2002 | Yeniay et al. | |
| 2002/0179929 A1* | 12/2002 | Takahashi et al. | 257/184 |
| 2002/0191904 A1* | 12/2002 | Kani et al. | 385/24 |
| 2003/0095737 A1* | 5/2003 | Welch et al. | 385/14 |
| 2004/0033004 A1* | 2/2004 | Welch et al. | 385/14 |

OTHER PUBLICATIONS

Kidorf H., et al., Pump Interactions in a 100-nm Bandwidth Raman Amplifier, IEEE Photonics Technology Letters, May 1999, 530-532, vol. 11, No. 5.

Koch, F., et al., Broadband Raman Gain Characterisation in Various Optical Fibres, Electronics Letters, Nov. 22, 2001, 1437-1439, vol. 37, No. 24.

Agrawal, G.P., Stimulated Raman Scattering, Nonlinear Fiber Optics, 1989, 218-262, Academic Press.

Fludger, C. R. S., et al., Pump to Signal RIN Transfer in Raman Fiber Amplifiers, Journal of Lightwave Technology, Aug. 2001, 1140-1148, vol. 19, No. 8.

Matsushita, S., et al., Design of Temperature Insensitive Depolarizer for Raman Pump Laser Diode, OSA Technical Digest, 2002, 181-183.

* cited by examiner

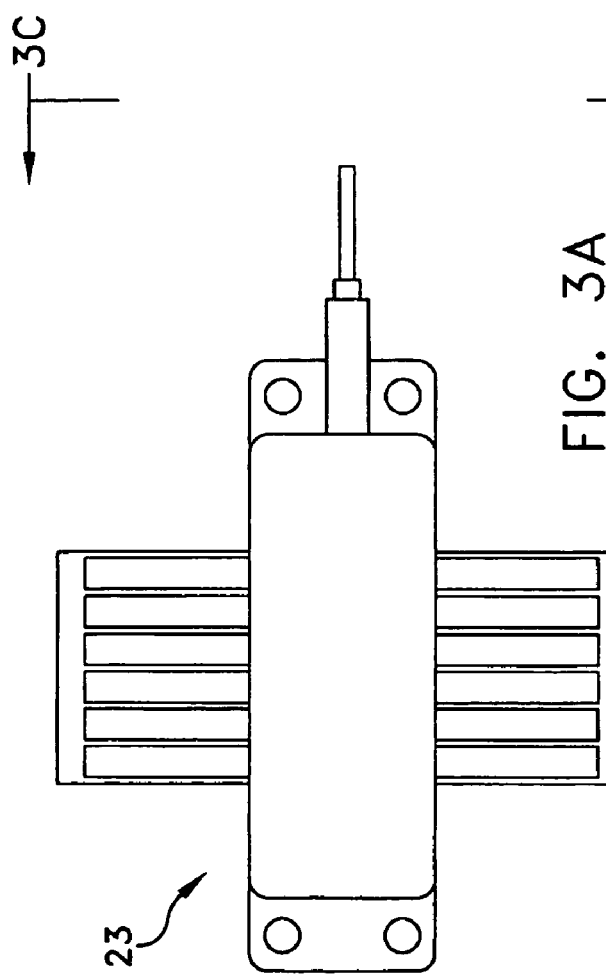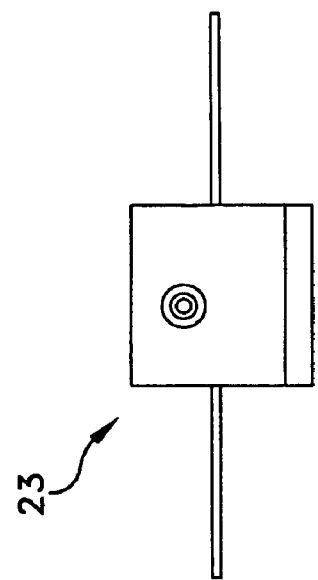
FIG. 3A
FIG. 3C
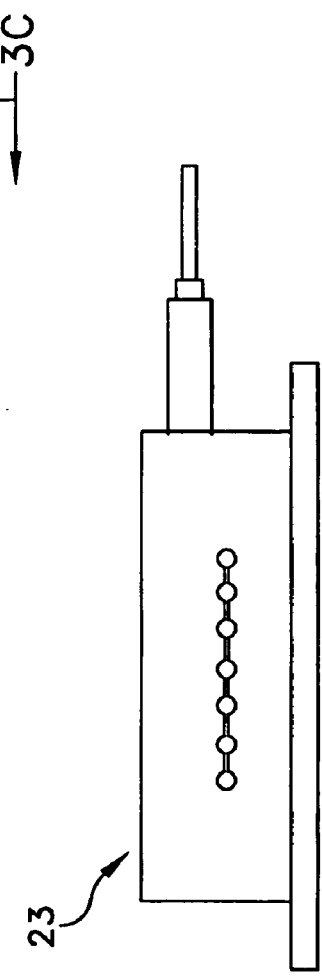
FIG. 3B

EXTENDED OPTICAL BANDWIDTH SEMICONDUCTOR SOURCE

REFERENCE TO PENDING PRIOR PATENT APPLICATIONS

This patent application:

(1) is a continuation-in-part of pending prior U.S. patent application Ser. No. 10/632,779, filed Aug. 1, 2003 by Daryoosh Vakhshoori et al. for SYSTEM FOR AMPLIFYING OPTICAL SIGNALS (2) claims benefit of pending prior U.S. Provisional Patent Application Ser. No. 60/454,036, filed Mar. 12, 2003 by Daryoosh Vakhshoori et al. for EXTENDED OPTICAL BANDWIDTH SEMICONDUCTOR SOURCE; and (3) claims benefit of pending prior U.S. Provisional Patent Application Ser. No. 60/549,310, filed Mar. 2, 2004 by Kevin J. Knopp et al. for BANDWIDTH ADJUSTABLE BROADBAND LIGHT SOURCE FOR OPTICAL COHERENCE TOMOGRAPHY.

The three (3) above-identified patent applications are hereby incorporated herein by reference.

FIELD OF THE INVENTION

This invention relates to optical components in general, and more particularly to optical components for generating light.

BACKGROUND OF THE INVENTION

In many applications it may be necessary and/or desirable to generate light.

Different optical components are well known in the art for generating light. By way of example but not limitation, semiconductor lasers, such as vertical cavity surface emitting lasers (VCSEL's), are well known in the art for generating light. Depending on the particular construction used, the light source may emit light across different portions of the wavelength spectrum. By way of example, many semiconductor-based light sources emit light across a relatively narrow portion of the wavelength spectrum. However, in many applications it may be necessary and/or desirable to provide a semiconductor light source which emits light across a relatively broad band of wavelengths.

The present invention is directed to a novel semiconductor light source for emitting light across an extended optical bandwidth.

SUMMARY OF THE INVENTION

The present invention provides an optical bandwidth source for generating amplified spontaneous emission (ASE) across a particular wavelength range, the optical bandwidth source comprising:

a waveguide having a first end and a second end, and the waveguide having a plurality of separate wavelength gain subsections arranged in a serial configuration to form an active waveguide between the first end and the second end;

wherein each of the wavelength gain subsections is arranged relative to one another so as to produce ASE across the particular wavelength range.

In another form of the invention, there is provided a system for generating amplified spontaneous emission (ASE) across a particular wavelength range, the system comprising:

an optical bandwidth source for generating the ASE across the particular wavelength range, the optical bandwidth source comprising:

a waveguide having a first end and a second end, and the waveguide having a plurality of separate wavelength gain subsections arranged in a serial configuration between the first end and the second end;

wherein each of the wavelength gain subsections is arranged relative to one another so as to produce ASE across the particular wavelength range;

a thin-film tap configured adjacent to the second end of the waveguide to divert a portion of the ASE produced by the waveguide to an auxiliary pathway;

a power monitor configured to receive the portion of the ASE diverted along the auxiliary pathway so as to monitor the ASE produced by the optical bandwidth source;

an isolator configured to receive the ASE remaining from the portion diverted toward the power monitor, the isolator configured to eliminate feedback therethrough toward the waveguide; and a single-mode filter fiber pigtail configured adjacent to the isolator in opposition to the waveguide so as to receive ASE emitted from the waveguide after passing through the isolator.

In another form of the invention, there is provided a method for generating amplified spontaneous emission (ASE) across a particular wavelength range, the method comprising:

providing a waveguide having a first end and a second end, and the waveguide having a plurality of separate waveguide gain subsections arranged in a serial configuration to form an active waveguide between the first end and the second end; and electrically biasing a first waveguide gain subsection and a second waveguide gain subsection from the plurality of separate waveguide gain subsections, the first waveguide gain subsection being configured between the first end and the second waveguide gain subsection, the second waveguide gain subsection being configured between the second end and the first waveguide gain subsection, and the first waveguide gain subsection configured with a quantum-well structure having a bandgap with lower energy than the second waveguide gain subsection so as to produce longer wavelength ASE at the first waveguide gain subsection than at the second waveguide gain subsection, wherein the waveguide produces ASE across the particular wavelength range at the second end thereof formed by ASE produced by the first waveguide section and the second waveguide section.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts and further wherein:

FIG. 3A is a schematic top view of a package incorporating the broadband semiconductor light source module shown in FIG. 2;

FIG. 3B is a schematic side view of a package incorporating the broadband semiconductor light source module shown in FIG. 2; and FIG. 3C is a schematic end view of a package incorporating the broadband semiconductor light source module shown in FIG. 2.

DETAILED DESCRIPTION OF THE PREFERRED EMBODIMENTS

Overview

The present invention is based on a novel seeded power-optical-amplifier (SPOA) technology. This technology relies on the amplification of a low-power seed optical spectrum by a long-cavity semiconductor waveguide optimized for power amplification. This SPOA technology results in a high-power (>200 mW) broad-band (~35 nm) source available from 650 to 1650 nm. To address market needs for sources of lower-power with an extended spectral bandwidth of 100 to 200 nm, the SPOA sources are serially-multiplexed. This approach addresses markets such as optical coherence tomography and spectral-sliced wavelength division multiplexing.

This novel broadband semiconductor light source provides significant advantages in performance, size, and cost over traditional semiconductor and super-continuum light sources.

Some of the technical advantages of this novel platform are:

(i) extended spectral bandwidth (FWHM of 100 to 200 nm);

(ii) high power (>20 mW);

(iii) single integrated chip: no spectral "stitching" or external combining is required;

(iv) smooth spectral shape with low secondary coherence function;

(v) compact size and low electrical power consumption; and (vi) compatible with reliable telcom-qualified packaging techniques.

Serial-Multiplexed Seeded Power-Optical-Amplifier

Figure 1:
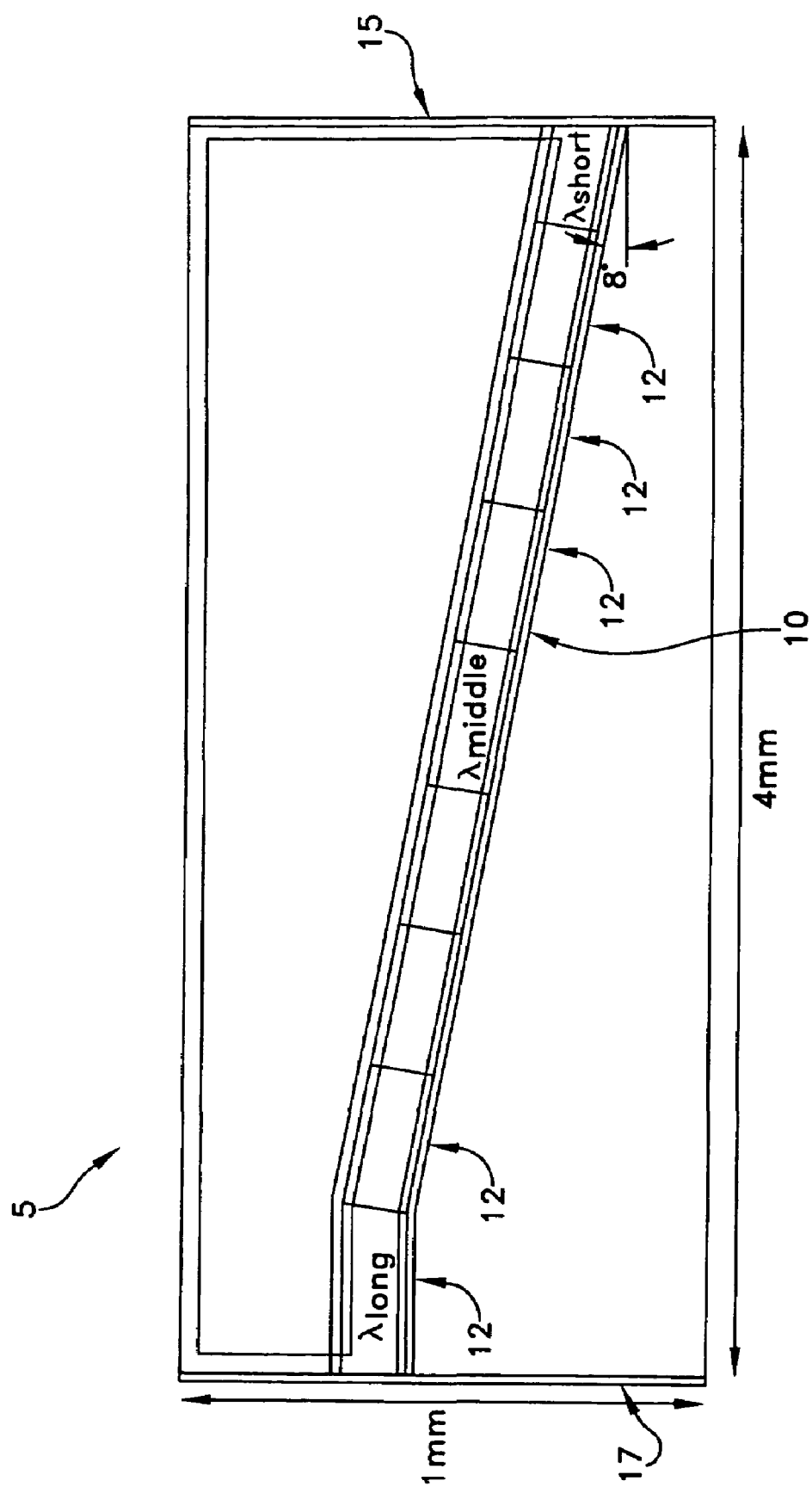
FIG. 1 is a schematic view illustrating one preferred form of broadband semiconductor light source formed in accordance with the present invention.

A schematic representation of a novel serial-multiplexed, seeded power-optical-amplifier (SM-SPOA) broadband light source die 5 is shown in FIG. 1.

The device 5 consists of a curved active waveguide 10 having a plurality of gain, or seed, subsections 12 serially disposed along waveguide 10. Preferably waveguide 10 is a single mode waveguide, although it may also be a multi-mode waveguide. Each gain, or seed, subsection 12 is adapted to generate amplified spontaneous emission (ASE). The gain profile along the waveguide 10 is engineered to generate ASE across a broad wavelength range (100–200 nm) when electrically biased above transparency. This is accomplished by varying the bandgap of the gain from lower to higher energy along the length of the waveguide in a discrete or continuous fashion using techniques such as semiconductor regrowth or quantum-well intermixing. In one preferred construction, each gain subsection 12 is configured to generate a different ASE profile. In another construction, waveguide 10 may be configured to have a continuous gradation along its length to change the bandgap and thus present what is essentially an infinite number of subsections 12. The ASE generated from the lower energy segments of the waveguide passes through the higher energy portions with low optical loss (<2 cm−1). An angled waveguide (8–13 degrees) is used at the output of the device, followed by an antireflection coating 15 deposited on the semiconductor facet. This combination is used to reduce feedback (<−50 dB) into the device and thus prevent distortion of the broadband spectral profile from Fabry Perot interference. The output will be highly linearly polarized due to the polarization dependence of the quantum-well gain. A high reflecting coating 17 is preferably placed on the opposite end of the device, e.g., at the end adjacent the low energy end of the waveguide.

Gain Subsections

The basic principle of device operation is the amplification of a plurality of gain, or seed, spectrums of amplified spontaneous emission (ASE) along the length of a semiconductor waveguide containing active regions which are biased above transparency. The manner in which the seed light is generated and shaped (i.e., filtered), the number of gain, or seed, spectrums used, and the optical bandgap and electrical bias of those sections, all may be varied according to the particular design considerations to be addressed. The semiconductor material system used depends to a large extent on the wavelength of the desired application. Among others, material systems such as AlAs, GaAs, InP, GaP, InGaAs, InGaAsP, InAlGaAs, and GaN can be used.

The die 5 consists of a serial connection of multiple gain subsections 12 formed along the semiconductor waveguide 10. Nine gain subsections 12 are shown in FIG. 1; however, it should be appreciated that this number is merely exemplary and more or less than this number of wavelength gain subsections may be used. The gain profile within each gain subsection 12 is chosen so as to provide ASE in a particular wavelength range. The gain profiles can be defined in each gain subsection 12 by such techniques as epitaxial regrowth or quantum-well intermixing. The quantum-well blocks of these gain subsections are designed to provide a region of high gain with, for example, 3–10 quantum wells.

A high reflectance mirror 17 is used to capture and redirect the portion of seed light traveling away from the output end of the device. The spectral profile of this mirror 17 is designed to provide the desired nominal ASE spectrum. This high reflectance mirror 17 can be defined through thin film coating of the cleaved semiconductor facet or by incorporating a distributed Bragg reflector along the waveguide. Each wavelength gain subsection 12 has an independent electrical contact to allow dynamic tailoring of the seed light spectrum. The output power of the wavelength gain sections 12 can range from 1 to 20 mW, although it is not limited to this range.

An angled waveguide 10 is used at the output of the device, followed by an antireflection coating 15 on the semiconductor facet. This combination is used to eliminate feedback into the device and to prevent distortion of the broadband spectral profile from Fabry-Perot interference.

The output of the device will be highly linearly polarized because of the polarization dependence of the quantum-well gain or, in the case of bulk active region, excess loss of TM over TE mode.

The spectral shape of the ASE generated by the device can be dynamically varied by changing the electrical bias applied to the various gain sections 12.

Optoelectronic Packaging

Figure 2:
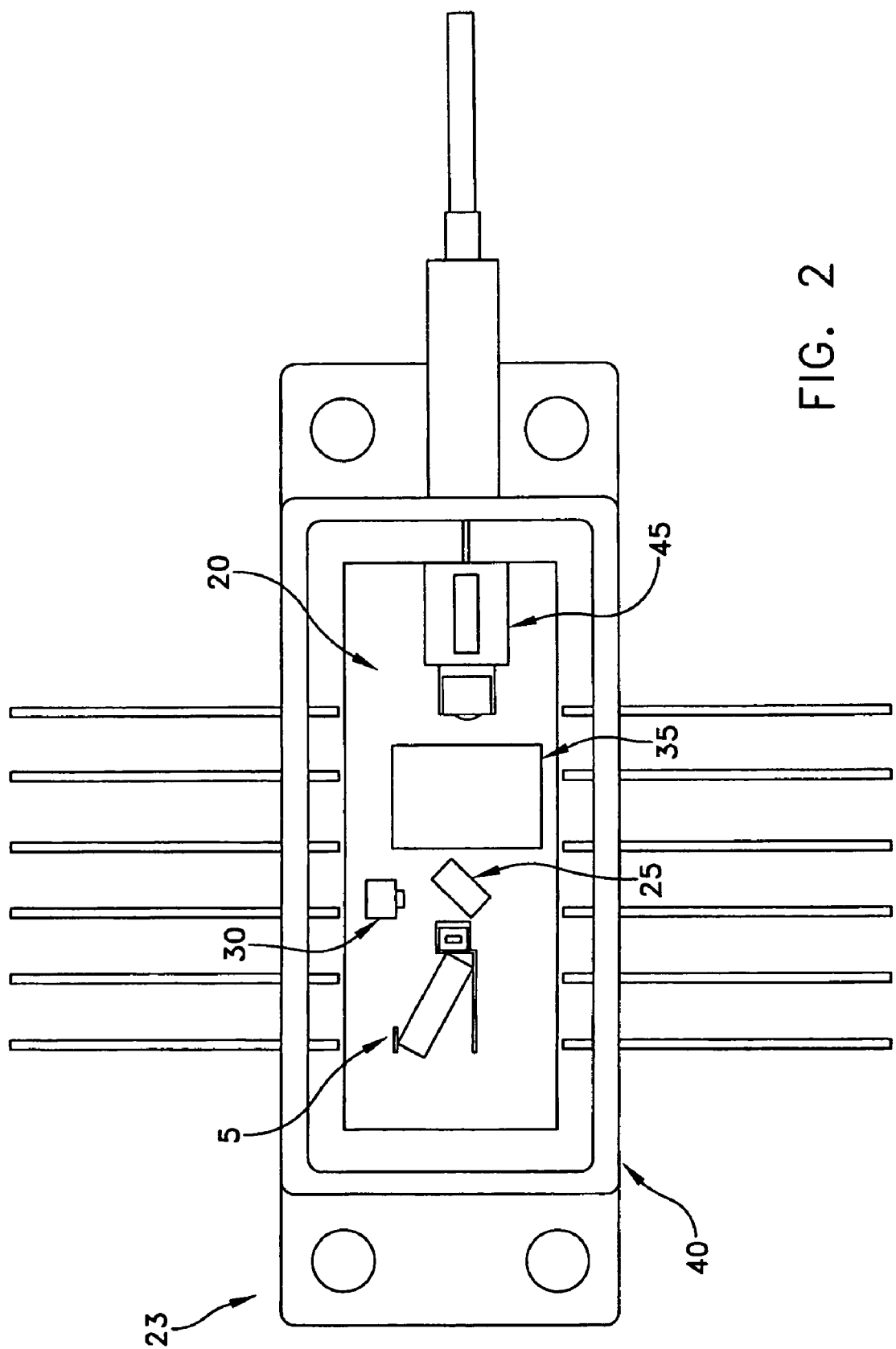
FIG. 2 is a schematic view illustrating one preferred form of broadband semiconductor light source module formed in accordance with the present invention.

Looking next at FIG. 2, the semiconductor die 5 may be soldered to an aluminum nitride carrier 20 and be packaged with its associated optical components so as to form a module 23. A thin-film tap 25 and photodetector 30 may be included to provide power monitoring functionality. The thin-film tap 25 is preferably also used for spectral shaping. More particularly, the thin-film coating on this optic is preferably designed to not only reflect a small fraction of light (e.g., 1%) to an auxiliary path, but also to refine and further shape the optical spectrum emitted from the semiconductor device. For many applications, features such as spectral ripples must be removed. The thin film coating preferably helps to do this and adjust the spectrum to approach the ideal Gaussian shape. Also, if desired, this optic could be stand-alone as a separate element from the tap and/or dynamically configurable. An optical isolator 35 may be used to eliminate feedback from downstream in the system. A thermoelectric cooler (TEC) (not shown, but preferably provided beneath aluminum nitride carrier 20) may be used to maintain the temperature of the entire optical platform. The optical train may be contained in a 14-pin hermetically-sealed butterfly package 40 with a single-mode fiber pigtail 45.

Alternatively, fiber pigtail 45 may be a multi-mode fiber pigtail.

FIGS. 3A, 3B and 3C show further details of the optical module 23 is shown in FIG. 3.

Optical Performance Specifications

In a preferred embodiment of the present invention, the broadband source module provides the performance criteria outlined in Table 1 over its life throughout the environmental conditions specified in Table 4. The specifications for the final product, alpha prototypes, and beta units are listed; however, it should be appreciated that this table is provided by way of example only and not by way of limitation.

TABLE 1

| Parameter | Unit | Min | Typical | Max | α | β | Final Product |
|---|---|---|---|---|---|---|---|
| Output Optical Power | mW | 10 | 25 | | ✓ | ✓ | ✓ |
| Spectral Bandwidth | nm | 100 | 200 | | ✓ | ✓ | ✓ |
| Center Wavelength | nm | 1290 | 1300 | 1310 | ✓ | ✓ | ✓ |
| Secondary Coherence Lobe[3] | dB | 30 | 50 | | ✓ | ✓ | ✓ |
| Relative Intensity Noise | dB/Hz | | | −100 f < 1 GHz | ✓ | ✓ | |

Mechanical Assembly

In a preferred embodiment of the present invention, there is provided a broadband source module having the mechanical attributes specified in Table 2 for the final product, alpha prototypes, and beta units; however, it should be appreciated that this table is provided by way of example only and not by way of limitation.

TABLE 2

| Parameter | Unit | Value | α | β | Final Product |
|---|---|---|---|---|---|
| Fiber Type | Type | Single-Mode | ✓ | ✓ | ✓ |
| Fiber Connector | Type | Bare | ✓ | ✓ | ✓ |
| Fiber Pigtail Length | m | >1 | ✓ | ✓ | ✓ |
| Package Style of Optical Module | Type | 14-Pin Butterfly | ✓ | ✓ | ✓ |
| Dimensions of Optical Module | mm | 42 × 12 × 13 | | ✓ | ✓ |
| Sealing of Optical Module | Type | Hermetic | | ✓ | ✓ |

Electrical Specifications

In a preferred embodiment of the present, a laser source module has the electrical requirements specified in Table 3 for the final product, alpha prototypes, and beta units; however, it should be appreciated that this table is provided by way of example only and not by way of limitation.

TABLE 3

| Parameter | Unit | Min | Typical | Max | α | β | Final Product |
|---|---|---|---|---|---|---|---|
| SM-SPOA Current | V | 0 | 2 | 2.3 | | ✓ | ✓ |
| Driver | A | 0 | 0.5 | 1.5 | | ✓ | ✓ |
| TEC Driver | V | −1.5 | | 1.5 | | ✓ | ✓ |
|  | A | −1.5 | | 1.5 | | ✓ | ✓ |
| Power Dissipation[4] | W | | | 5 | | ✓ | ✓ |
| Thermistor Resistance (@ 25° C.) | kΩ | 9.5 | 10 | 10.5 | ✓ | ✓ | ✓ |
| Monitor Photodiode Dark Current ($V_{reverse}$ = 5V) | nA | | | 100 | | ✓ | ✓ |
| Signal Power Monitor Responsivity ($V_{reverse}$ = 5V) | μA/mW | 3.8 | 4 | 4.2 | | ✓ | ✓ |

Environmental Conditions

The environmental operating conditions are shown in Table 4; however, it should be appreciated that this table is provided by way of example only and not by way of limitation.

TABLE 4

| Parameter | Unit | Value | α | β | Final Product |
|---|---|---|---|---|---|
| Operating Temperature | ° C. | 5 to 45 | | ✓ | ✓ |
| Storage Temperature Range | ° C. | −40 to 75 | | ✓ | ✓ |
| Operating Humidity Range | % | 0 to 90 | | ✓ | ✓ |

QUALIFICATION

The broadband source module has a mean time to failure (MTTF) of greater than 10,000 hours. End of life (EOL) is considered to occur when the specifications of Table 1 can no longer be met. Processes and techniques compatible with Telcordia qualification standards are preferably used to ensure reliable operation. Qualification testing includes: aging, storage, damp-heat, thermal cycling, and mechanical shock/vibration. Other tests may be performed as needed to ensure product quality.

What is claimed is:

1. An optical bandwidth source for generating amplified spontaneous emission (ASE) across a selected wavelength range, the optical bandwidth source comprising:
   a waveguide having a first end and a second end, and comprising a plurality of separate wavelength gain subsections arranged in a serial configuration between the first end and the second end so as to collectively form an active waveguide between the first end and the second end;
   wherein each of the wavelength gain subsections is configured to produce ASE across a wavelength range which is less than, but contained within, the selected wavelength range, whereby the plurality of separate wavelength gain subsections collectively produce ASE across the selected wavelength range.

2. An optical bandwidth source according to claim 1 wherein said waveguide comprises a single mode waveguide.

3. An optical bandwidth source according to claim 1 wherein said waveguide comprises a multi-mode waveguide.

4. An optical bandwidth source according to claim 1 wherein the selected wavelength range has a bandwidth of at least 100 nm.

5. An optical bandwidth source according to claim 4 wherein the bandwidth of the selected wavelength range is about 200 nm.

6. An optical bandwidth source according to claim 1 wherein the waveguide comprises a quantum-well structure having a gain profile which varies from the first end of the waveguide toward the second end of the waveguide so as to form the plurality of separate wavelength gain subsections, and further wherein the gain profile of the quantum-well structure comprises a bandgap varying from lower to higher energy.

7. An optical bandwidth source according to claim 6 wherein the gain profile of the quantum-well structure is varied in a discrete fashion along a length of the waveguide.

8. An optical bandwidth source according to claim 6 wherein the gain profile of the quantum-well structure is varied in a continuous fashion along a length of the waveguide.

9. An optical bandwidth source according to claim 6 wherein the quantum-well structure is formed by semiconductor regrowth.

10. An optical bandwidth source according to claim 6 wherein the quantum-well structure is formed by quantum-well intermixing.

11. An optical bandwidth source according to claim 1 wherein at least a portion of the waveguide is curved between the first end and the second end.

12. An optical bandwidth source according to claim 11 wherein the curved portion of the waveguide forms an angle within a range of about 8° to 13°.

13. An optical bandwidth source according to claim 12 further comprising an antireflection coating deposited adjacent to the second end of the waveguide.

14. An optical bandwidth source according to claim 11 wherein the second end of the waveguide comprises a semiconductor facet having the antireflection coating disposed thereon so as to prevent distortion of a profile of the generated ASE.

15. An optical bandwidth source according to claim 14 further comprising a mirror disposed at the first end of the waveguide.

16. An optical bandwidth source according to claim 1 wherein each of the plurality of separate wavelength gain subsections comprises independent electrical contacts whereby to permit dynamic tailoring of the amplified spontaneous emission (ASE) across the selected wavelength range.

17. A system for generating amplified spontaneous emission (ASE) across a selected wavelength range, the system comprising:
   an optical bandwidth source for generating the ASE across the selected wavelength range, the optical bandwidth source comprising:
   a waveguide having a first end and a second end, and comprising a plurality of separate wavelength gain subsections arranged in a serial configuration between the first end and the second end so as to collectively form an active waveguide between the first end and the second end;
   wherein each of the wavelength gain subsections is configured to produce ASE across a wavelength range which is less than, but contained within, the selected wavelength range, whereby the plurality of separate wavelength gain subsections collectively produce ASE across the selected wavelength range;
   a thin-film tap configured adjacent to the second end of the waveguide to divert a portion of the ASE produced by the waveguide to an auxiliary pathway;
   a power monitor configured to receive the portion of the ASE diverted along the auxiliary pathway so as to monitor the ASE produced by the optical bandwidth source;
   an isolator configured to receive the ASE remaining from the portion diverted toward the power monitor, the isolator configured to eliminate feedback therethrough toward the waveguide; and
   a filter fiber pigtail configured adjacent to the isolator in opposition to the waveguide so as to receive ASE emitted from the waveguide after passing through the isolator.

18. A system according to claim 17 wherein said waveguide is a single mode waveguide and further wherein said filter fiber pigtail is a single mode filter fiber pigtail.

19. A system according to claim 18 wherein said waveguide is a multi-mode waveguide and further wherein said filter fiber pigtail is a multi-mode filter fiber pigtail.

20. A system according to claim 17 further comprising a mounting substrate in thermal connection to a thermoelectric cooling device (TEC), and the mounting substrate in thermal connection to the optical bandwidth source.

21. A system according to claim 20 wherein the mounting substrate is in aluminum nitride carrier.

22. A method for generating amplified spontaneous emission (ASE) across a selected wavelength range, the method comprising:
   providing a waveguide having a first end and a second end, and comprising a plurality of separate wavelength gain subsections arranged in a serial configuration between the first end and the second end so as to collectively form an active waveguide between the first end and the second end;
   wherein each of the wavelength gain subsections is configured to produce ASE across a wavelength range which is less than, but contained within, the selected wavelength range, whereby the plurality of separate wavelength gain subsections collectively produce ASE across the particular selected wavelength range; and electrically biasing a first waveguide gain subsection and a second waveguide gain subsection from the plurality of separate waveguide gain subsections, the first waveguide gain subsection being configured between the first end and the second waveguide gain subsection, the second waveguide gain subsection being configured between the second end and the first waveguide gain subsection, and the first waveguide gain subsection configured with a quantum-well structure having a bandgap with lower energy than the second waveguide gain subsection so as to produce longer wavelength ASE at the first waveguide gain subsection than at the second waveguide gain subsection, wherein the waveguide produces ASE across the selected wavelength range at the second end thereof formed by ASE produced by the first waveguide section and the second waveguide section.

23. A method according to claim 22 wherein said waveguide comprises a single mode waveguide.

24. A method according to claim 22 wherein said waveguide comprises a multi-mode waveguide.

25. A method according to claim 22 wherein the particular wavelength range has a width of at least 100 nm.

26. A method according to claim 22 wherein the width of the particular wavelength range is about 200 nm.

27. An optical bandwidth source according to claim 22 wherein each of the plurality of separate wavelength gain subsections comprises independent electrical contacts whereby to permit dynamic tailoring of the amplified spontaneous emission (ASE) across the selected wavelength range.

28. An optical bandwidth source according to claim 22 wherein the thin-film tap is configured to tailor the spectral shape of the amplified spontaneous emission (ASE) across the selected wavelength range.

* * * * *

UNITED STATES PATENT AND TRADEMARK OFFICE
CERTIFICATE OF CORRECTION

PATENT NO.        : 7,068,905 B2                                  Page 1 of 1
APPLICATION NO.   : 10/800206
DATED             : June 27, 2006
INVENTOR(S)       : Daryoosh Vakhshoori et al.

It is certified that error appears in the above-identified patent and that said Letters Patent is hereby corrected as shown below:

Column 1, Line 24, please insert:

--STATEMENT REGARDING FEDERALLY SPONSORED RESEARCH

This invention was made with Government support under Contract Number 1 R44 EB004289-01 awarded by the National Institute for Biomedical Imaging and Bioengineering (National Institutes of Health). The Government has certain rights in the invention.--

Signed and Sealed this

Second Day of December, 2008

JON W. DUDAS
*Director of the United States Patent and Trademark Office*